United States Patent [19]
Hellmig

[11] 3,977,872
[45] Aug. 31, 1976

[54] PROCESS FOR THE PRODUCTION OF NEGATIVE CONTINUOUS-TONE IMAGES

[75] Inventor: Ehrhard Hellmig, Leverkusen, Germany

[73] Assignee: AGFA-Gevaert, A.G., Leverkusen, Germany

[22] Filed: July 7, 1975

[21] Appl. No.: 593,688

Related U.S. Application Data

[63] Continuation of Ser. No. 369,605, June 13, 1973, abandoned, and a continuation of Ser. No. 133,529, April 13, 1971, abandoned.

[30] Foreign Application Priority Data

Apr. 18, 1970 Germany............................ 2018735

[52] U.S. Cl.................................. 96/17; 96/27 R; 96/69
[51] Int. Cl.²...................... G03C 7/16; G03C 5/04; G03C 1/76
[58] Field of Search............ 96/68, 69, 17, 23, 27 E, 96/45

[56] References Cited
UNITED STATES PATENTS

| | | | |
|---|---|---|---|
| 2,535,370 | 12/1950 | Pohl........................ | 96/17 |
| 3,130,053 | 4/1964 | Hellmig et al. ........................ | 96/69 |
| 3,141,773 | 7/1964 | Hellmig.................................. | 96/68 |
| 3,300,308 | 1/1967 | Jemseby................................ | 96/45 |
| 3,396,024 | 8/1968 | Hellmig et al. ........................ | 96/69 |
| 3,493,370 | 2/1970 | Attinello................................ | 96/23 |
| 3,663,228 | 5/1972 | Wyckoff................................. | 96/68 |
| 3,676,122 | 7/1972 | Hellmig.................................. | 96/17 |
| 3,728,121 | 4/1973 | Zorn et al.............................. | 96/68 |
| 3,745,008 | 7/1973 | Hellmig.................................. | 96/17 |

*Primary Examiner*—Mary F. Kelley
*Attorney, Agent, or Firm*—Connolly and Hutz

[57] ABSTRACT

Negative continuous-tone images or continuous-tone separation records having standardized contrast are produced from originals which are differing in contrast by means of a photograhic material the silver halide emulsion of which has a characteristic curve with a sagging course defined below, whereby the part of characteristic curve which is utilized for the production of the continuous-tone negative depends on the contrast of the original.

7 Claims, 6 Drawing Figures

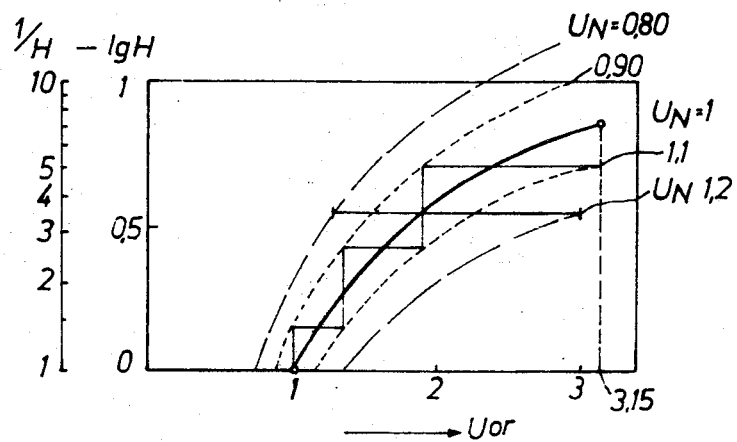
FIG. 3
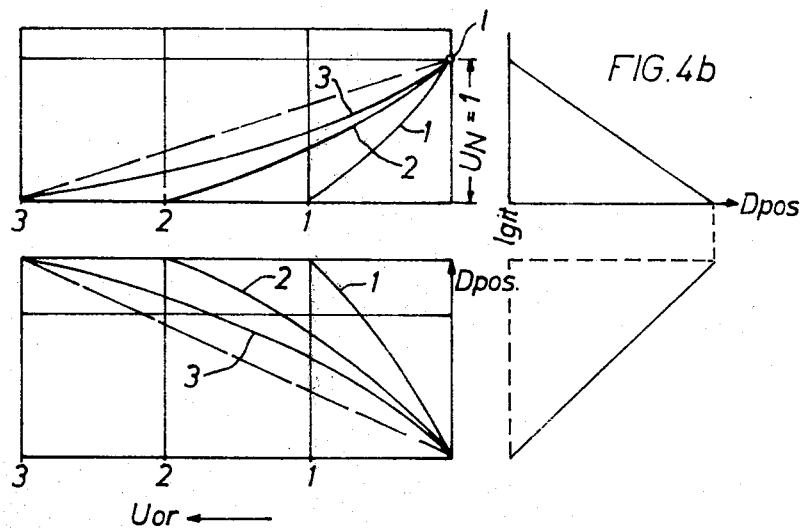
FIG. 4a
FIG. 4b
FIG. 4c
INVENTOR:
EHRHARD HELLMIG.

PROCESS FOR THE PRODUCTION OF NEGATIVE CONTINUOUS-TONE IMAGES

CROSS REFERENCES TO RELATED APPLICATIONS

This application is a continuation of copending continuation application Ser. No. 369,605, filed June 13, 1973 now abandoned and abandoned application Ser. No. 133,529 filed Apr. 13, 1971, by the same inventor.

BACKGROUND OF THE INVENTION

The invention relates to production of negative continuous-tone image by means of a photographic material comprising at least one silver halide emulsion layer the characteristic curve of which has a defined sagging course.

Reproduction of continuous-tone original is conventionally carried out by first producing a negative continuous-tone image from which a positive continuous-tone image or a screened image is then prepared which serves as an original for the subsequent photomechanical process (layer which are hardened upon exposure, pigment paper, transfer film, etc.) for the production of the printing form. The continuous-tone original may be a black and white or multicolor reflection copy or transparency. In the case of a color image, the negative continuous-tone images are color separation negatives if they have been obtained using color separation filters. These continuous-tone negatives are usually produced by exposure in a reproduction camera, in other words by optical exposure, but they may also be produced by contact.

Since the contrasts of originals used for reproduction, i.e. the differences in density between the lightest and darkest important parts of the image ("light" and "shadow") in practice vary over a wide range of about 1.00 to 3.00, especially in the case of transparent multicolor originals (color reversal diapositives) whereas the continuous-tone negatives produced from them (color separation records) are required to have a substantially narrower range of variation in this respect (prestandardisation) or may even be required to have a fixed value for the contrast with narrow tolerances if they are to be used by conventional methods (standardised negatives), the reproduction process requires the use of several films, generally three, with stepped gradation $\gamma$ ($\gamma$ about 0.50, 0.90 and 1.40).

As is well known, the use of several types of films for the same purpose entails numerous disadvantages both for the manufacturer and for the consumer since the different films cannot be produced so accurately that they will be sufficiently uniform in all their essential properties, and there may be unavoidable differences, e.g. in the sensitivity, the filter factors, the color of the silver image, the uniform fog density, the so-called residual coloring (due to the sensitizer or the antihalation layer) the dimension stability, etc.. Moreover, it is very inconvenient both for the manufacturer and the supplier and especially the photographer in the dark room to keep several films in reserve, and in the dark room especially it requires great care to ensure that they will not be mixed up. Moreover, the production of three different films is not efficient from the manufacturer's point of view. To this is added the fact that the production of light sensitive layers which have a very flat density curve extending in a straight line right up to high densities, which is necessary at least for the flattest of the three films mentioned above, involves considerable difficulties in the preparation of the emulsions.

Assuming that the exposed continuous-tone materials will be processed automatically in processing machines which for reasons of efficiency can only be operated with a particular development time, then continuous-tone images (color separation records) having a standardised contrast can no longer be produced by the methods hitherto employed and consequently their subsequent treatment by conventional methods is also impossible or at least extremely difficult since the subsequent operations must be carried out manually with variation of the development time.

Although in principle it is known how to produce standardised or prestandardised continuous-tone images even with processing machines since the gamma value or gradation of the material can be controlled by the color of the light used for exposure, the process employed is not suitable for multicolored reproduction because in the production of color separation records which, as is well known, are obtained with narrow-band blue, green and red filters, it is not possible to vary the color of the light for the purpose of controlling the gradation. For multicolor reproduction, therefore, the production of standardised color separation records using processing machines remains an unsolved problem in the present state of the art. The same applies to the production of prestandardised color separation records and, even more so to the production of standardised color separation records with the aid of a processing machine, if only one separation film is used for all the originals having the contrast ranges specified above.

Even the reproduction of black and white originals in which the above mentioned material whose gradation can be varied with the color of the light is used and standardised or prestandardised image can be produced, still entails difficulties and disadvantages which lie especially in the choice of the correct color of light (exposure with two color filters in succession with predetermined exposure time) and in the complicated technique used for exposure, which requires careful attention and time (calculations, readings of tables and graphs for adjustment of the exposure times). If this work is carried out with the aid of one of the known technical instruments, again increased technical expenditure and therefore cost is involved.

It is among the objects of the invention to provide processes for the production of negative continuous-tone images, which as a result of suitable choice of the sensitometric properties of the copying materials used, are suitable for automatic, mechanical processing methods.

SUMMARY

A process for the production of negative continuous-tone images or continuous-tone color separation records by exposure of a copying material, which contains at least one silver halide emulsion layer, to light reflected from or transmitted through black and white or colored originals which have different contrasts, using a camera or exposing in contact with the originals, has now been found in which the density curve of the silver halide emulsion of the copying material has a substantially uniform progressive positive gradient over a log. It interval which extends at least over the maximum contrast of the originals, and the originals are copied in that part of the density curve in which the curve is steeper the lower the contrast of the original.

BRIEF DESCRIPTION OF THE DRAWINGS

Novel features and advantages of the present invention will become apparent to one skilled in the art from a reading of the following description in conjunction with the accompanying drawings wherein similar reference characters refer to similar parts and in which:

FIG. 3 is a graphical representation showing the exposure (1/H or the negative logarithm of H) vs. the contrast range in the original ($U_{or}$) and several curves representing different contrastranges of negatives, $U_N$;

FIG. 4a is a graphical representation of the density curves of negatives produced on the material characterized in FIG. 1 from three originals having three different contrast ranges;

FIG. 4b is a quadrant of the characteristic curve of a particular copying material, rotated through 90° (windmill diagram) relative to FIG. 4a; and FIG. 4c is a graphical representation of variations in density of standardized continuous-tone positives for the different negative density curves shown in FIG. 4a.

DESCRIPTION OF THE PREFERRED EMBODIMENTS

Figure 1:
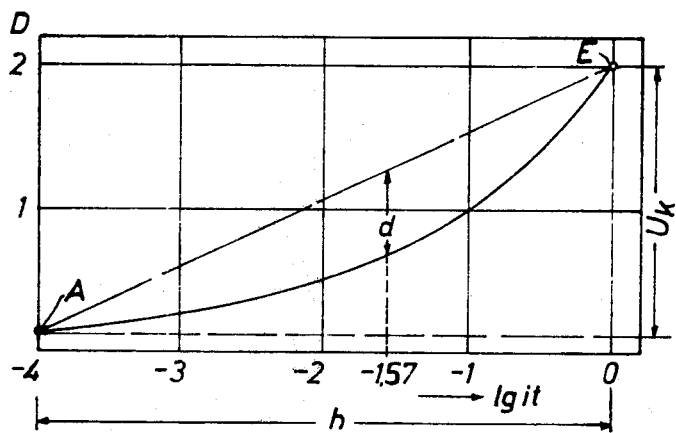
FIG. 1 is a graphical representation of density (D) vs. log exposure (lgH = lg It) showing the characteristic curve of the material of this invention in solid outline in relation to a prior art curve shown in broken outline.

The basic principle of the invention is shown diagrammatically in FIG. 1. The density curve starts at the point A which starts with a comparatively flat rise immediately above the fog or at a predetermined value above this (e.g. density 0.30) and continues progressively to higher log.It values until a maximum (E) is reached. This curve must extend at least over a log. It range h equal to the maximum contrast $U_{or}$ (max) of all the original specimens used for reproduction, in the case of transparent originals mentioned above over a range of $h \geq 3.00$.

Although the further extension of this range is not restricted in principle it is limited in practice. In the direction of smaller log.It values it is limited by a minimum value of the gradation below which the image can no longer be regarded as recorded. If one sets this value at e.g. 0.10 in the positive image drawn from the corresponding negative, i.e. $\gamma$ B = 0.10, then the minimum gradation of the negative density curve $\gamma$ N (min) = $0.10/\gamma_p$ where $\gamma_p$ is the gradation of the positive compying material or, since $U_p = \gamma_p \cdot U_N, \gamma_{N(min)} = 0.10$ ($U_N/U_P$) where $U_N$ and $U_P$ represent the contrast of the negative and the contrast of the positive which is to be produced from it. When $U_N = 1.00$ and $U_P = 1.40$ is $\gamma$ min = 0.07 for example. However, a different value may be chosen for the minimum gradation of the negative density curve according to the particular case.

The value for the interval h is limited upwardly by the maximum permissible density $D_E$ of the point E in the negatives or color separation records, and this depends mainly on the intensity of the photographic and copying sources of light, the sensitivity of the photographic and copying film and to a certain extent also on the observer's ability to assess the negatives or color separation records visually if this assessment comes into the reproduction process. Under the operating conditions currently used in practice, this maximum density value $D_E$ may be set at 2.50. On account of both these conditions, the interval h must not be unduly high. In the example of the density curve shown in FIG. 1, it is 4.00.

Furthermore, the density curve must run a substantially smoothly sagging course rather like a cable not completely tightly stretched between A and E, so that the maximum amount of sagging $d$ (maximum vertical distance between the density curve and the straight line connecting the points A and E) is not close to either of the end points A or E but in the middle region, preferably within the third to fifth sixth of the interval h.

The density curve is preferably characterised in that the density at the middle of the interval h is 10 to 40 % of the total increase $U_K$ ($U_K = D_E - D_A$ where $D_A$ and $D_E$ are the density values at A and E) from the initial density $D_A$. Furthermore, the density curve is preferably characterised by the fact that the amount of sagging $d$ does not exceed 50 % of $U_K$.

The density curve need not necessarily rise progressively at every point. The inclination may be rectilinear in portions, especially in the region of low densities and/or the region of highest densities.

A particular important type of density curve of this kind is obtained if the density values increase in geometrical progression (by the same factor) with successive log.It intervals. Mathematically, this curve is expressed by the exponential function $D_{(X)} = D_A \cdot 10^{KX}$ where $D_{(X)}$ is the density at the point $X$ = log.It, $D_A$ = the density at the starting point A of the curve where $X$ = O and K is a constant which determines the progression of the inclination.

A curve of this type is shown in FIG. 1. Starting from a density of $D_A = 0.125$, the densities increase in the interval $\Delta \log.It = 1.0$ by the factor 2, so that for the log.It coordinates −4.0, −3.0, −2.0, −1.0 and 0.0 the density values obtained are 0.125, 0.25, 0.50, 1.0 and 2.0.

The curve obeys the equation $D_{(X)} = 0.125 \cdot 2^X = 0.125 \cdot 10^{0.301 \, X}$ if the zero point of the x axis is placed at the starting point A of the curve (point −4.0 in FIG. 1). From this it follows that K = 0.301.

To illustrate how this works out in practice, the specific figures mentioned above will now be summarized: $h = 4.00$; $D_A = 0.125$, $D_E = 2.00$, and hence $U_K = D_E - D_A = 1.875$; the density of the halfway point $h/2$ of the interval is $D(h/2) = 0.50 = 0.375$ higher than $D_A = 0.375/1.875 \cdot 100 \% = 20 \%$ higher than $D_A$. Sagging $d = 0.553/1.875 \cdot 100 \% = 29.3 \%$; position for $d$ at log.It = −1.57, in other words in the fourth six of h. This shows that the density curve meets the required criteria for the preferred type of curve.

Other density curves $D^*(X)$ can be derived from this density curve (FIG. 1) in accordance with the present invention. These curves obey the equation $D^*(X) = D(X) + \alpha \cdot d(X)$ where $D(X)$ is the function mentioned above, $d(X)$ is the "sagging function" of the sage between $D(X)$ and the straight line AE (FIG. 1) and $\alpha$ is a positive or negative number smaller than 1.0; $\alpha$ naturally only occurs in this equation in cases where $D^*(X)$ maintains its positive progression.

Another group of density curves of a material which may be used for the process according to the invention is obtained if the above exponential function $D_{(X)}$ =

$D_A \cdot 10^{KX}$ is used with the density $D_E$ of the end point of the density curve substituted for K. In that case $$D_{(x)} = D_A 10^{X/X_E \cdot \log DE/DA}$$

in which $X_E$ is the abscissa for $D_E$, in other words $D_{(XE)}$ is $D_E$. The above mentioned group of curves is obtained if a variable parameter S (density of fog or "basic grey") is introduced into the above equation so that $$D_{(x)} = (D_A - S) 10^{X/X_E \cdot \log DE - S/DA - S} + S$$

wherein S must be smaller than $D_A$ and may even assume negative values. For each of these chosen values of S which may have any value provided it meets the above condition, a progressively rising density curve connecting the points A and E is obtained, and the above equation therefore represents a whole family of density curves in accordance with the present invention all of which pass through the starting point A (density $D_A$) and the end point E (density $D_E$).

According to the invention, exposure of the photographic material is carried out in such a way that the original with the higher contrast is recorded in the flatter part of the density curve and those with the lower contrast in the steeper part of the curve. If the entire range of densities extending over h is used for copying the originals, the shadow part of the original which has the highest contrast is copied with the lowest density value of the density curve (point A) and the light part of the original which has the lowest contrast is copied with the highest density value of the curve (point E). The originals which have intermediate contrasts are copied on the density curve between these two extremes, the higher contrast of the original being advantageously but not necessarily associated with a higher contrast in the negative.

In the example of the density curve in FIG. 1, an original having the value Uor (max.) = 3.00 results in a contrast of the negative copy of $U_N = 0.875$, an original having the value Uor (min.) = 1.00 results in a contrast of the negative of $U_N = 1.00$. One recognises by this the prestandardisation of the negatives, all the contrasts of the originals within the wide contrast range of 1.00 to 3.00 (ratio 1:3) being concentrated to the narrow range of negative contrasts between 0.875 and 1.00 (ratio 1:1.14).

Figure 2:
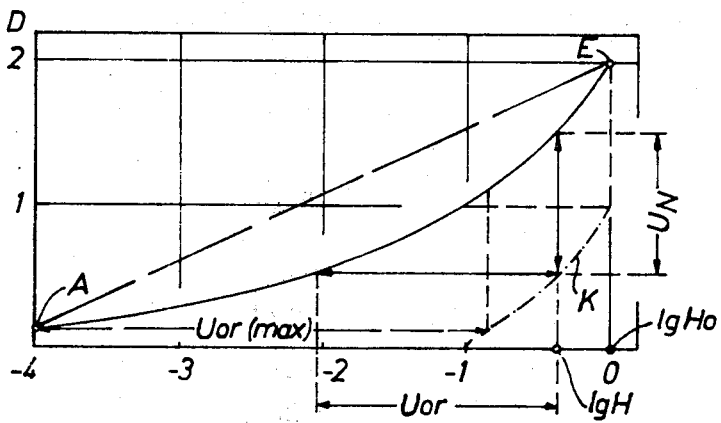
FIG. 2 is a graphical representation similar to FIG. 1 with the addition of a curve K representing the range of contrast of originals $U_{or}$ which can be reproduced by the inventive method for a standardized negative contrast range of 1.00.

The production of strictly standardised negatives is illustrated in FIG. 2. The standardised contrast $U_N$ of the negatives 1.00 chosen as example corresponds to the original contrast Uor. Any contrasts in the original which are at all capable of being reproduced are situated in the horizontal distances between the characteristic curve and the dashdot curve K which extends at a vertical distance of 1.00 from the density curve. They cover the range from $U_{or}(min) = 1.00$ to $U_{or}(max) = 3.15$. The great efficiency of the process according to the invention which operates with a sagging characteristic curve becomes clear when one considers that a straight lined characteristic curve (connecting curve AE) is only capable of reproducing a single original contrast under the given condition $U_N = 1.00$. Corresponding to each original contrast is a certain exposure H (in logarithmic units). It indicates with what exposure the original having a contrast Uor must be exposed to produce a negative having a density contrast of $U_N = 1.00$.

The relationship between exposure H and original contrast $U_{or}$ for this example (FIG. 2) is represented graphically in FIG. 3 (continuous line curve $U_N = 1.0$) in which the numerical values for H based on the "basic exposure" $H_o$ (original specimen with lowest reproducible contrast (in this case Uor(min.)=1.00) are shown side by side with the logarithmic units of exposure. The graph shows that a negative contrast of $U_N = 1.00$ can be used for reproducing any original specimens which have a contrast Uor of between Uor (max.) = 3.15 and Uor (min.) = 1.00. The maximum exposure (Uor = 3.15) is only seven times as great as the minimum exposure (Uor = 1.00). This small range of exposures is particularly surprising since for a range of contrasts extending over more than two powers of 10 (1.00 to 3.15) and hence also shadow exposures extending over this range one had to expect a ratio of 1:100. In practice, this constitutes a great advantage because it enables the process to be kept running smoothly. Another advantage of this process is that standardised negatives are produced with only a single exposure and moreover with unfiltered light whereas the known processes mentioned above, insofar as they were capable of solving the same problem at all (only black and white reproduction), requires two accurately dosed exposures through two different colored filters.

The course of the exposure curve in FIG. 3 is most easily determined by practical tests in which a grey wedge is copied with stepped exposure times on to the continuous-tone copying material or photographed in a camera. When using this curve for practical purposes, it should be remembered that it is only applicable if the density of the light parts always has the same value in all the originals. If strictly standardised copies are to be produced, deviations from this constant value must be taken into account in known manner by means of a correction. For producing prestandardised copies, which are quite generally preferred, this correction can be omitted.

The exposure times for the production of prestandardised copies are also obtained from FIG. 3. If, for example, the copies are required to have a contrast of between $U_N = 0.80$ and $U_N = 1.20$, their exposure is determined according to the contrast by the range enclosed between the two corresponding limiting curves (broken lines). This range of exposures is surprisingly large, as seen in FIG. 3. The shortest possible exposure time (for $U_N = 1.20$) and the longest possible exposure time ($U_N = 0.80$) are related to each other as 1:4. This applies (as shown in FIG. 1) to any contrast in the original. It is therefore not necessary to take any special care in the exposure of prestandardised copies having contrasts in the range of $U_N = 8.0$ to 1.20. A single exposure H (lg H = 0.55, H = 3.55) is sufficient for reproducing any contrasts in the originals of between 1.28 and 3.00 with a tolerance of $U_N = $ 1.00 ± 0.20. This result, which is of general importance constitutes a great practical advantage since it eliminates the need for any calculations or readings of exposure times from tables or graphs as well as adjustments of the exposure timer on the camera. Originals having contrasts of below 1.28 and down to Uor = 0.74 are reproduced with the exposure H = 1.00 so that the total original contrast of 0.74 to 3.00 can be covered with only two exposures (H = 1.00 and 3.55).

The number of separate exposures increases for stricter tolerances of the negative contrasts but still remains tolerable. Thus negatives having a half tolerance ($U_N = 1.00 \pm 0.10$) can be produced from any originals having contrasts of $U_H = 1.00$ to 3.00 with only three separate exposures (lg H =/.72; 0.43; 0.15) ("stepped curve" in FIG. 3).

The advantages of the process according to the invention for these two examples ($U_N = 1.00 \pm 0.20$ and $1.00 \pm 0.10$) are seen when comparing the reproducible contrasts which can be obtained with the sagging density curve (FIG. 1) on the one hand and the rectilinear density (AE (FIG. 1)) on the other hand.

| Density curve (FIG. 1) | Reproducible contrast for | |
|---|---|---|
| | $U_N = 1.00 \pm 0.20$ | $1.00 \pm 0.10$ |
| a) sagging | 0.74–3.41 = 2.67 units | 0.87–3.28 = 2.41 u. |
| b) rectilinear (AE) | 1.33–2.00 = 0.67 units | 1.50–1.83 = 0.33 u. |
| Extension from a) towards b) equal to | 2.00 units 400 % | 2.08 units 724 % |

The amount of contrast which can be reproduced is considerably increased by the process according to the invention compared with the contrast which is reproducible with a linear density curve, in the case of our example by the factors of 4 and 7.24, respectively. Conversely, the amount of contrast which can be reproduced with the rectilinear density curve is only 25 % and 14 %, respectively, of the contrast which can be reproduced with the process according to the invention.

All these advantages which can be derived in the case of the density curve in FIG. 1 given by way of example remain in principle the same for other corresponding density curves since the advantages arise from the sagging progression of the curve.

The exposed negative photographic material obtained by the process according to the invention are now processed in known manner to produce either continuous-tone positives or raster (screened) positives. If the negatives are standardised, they are copied on to one of the usual continuous-tone or lithographic materials and then processed. If they have only been prestandardised, one of the photographic materials mentioned above whose gradation can be varied by the color of the copying light is used as copying material for continuous-tone positives, standardisation of the continuous-tone positives being thereby achieved (e.g. according to DIN 16 602). One such material, for example, is sold under the name of "GEVAREX-film" by Gevaert-Agfa N.V. GEVAREX is the trademark of Gevaert-Agfa N.V. for a photographic film. In both cases, it is advantageous for the purpose of increasing the efficiency of the process to treat the exposed positive material by the same photographic process (in the same processing machine) as the negative copies.

If, on the other hand, standardised screen positives are required, as is the case for offset or letterpress printing, they are produced by an analogous method using a steep raster film ("Lithfilm" with a steep gamma value) and a colored contact screen interposed between them; this is also known in detail.

It is unexpectedly found that using the photographic material which has a sagging density curve has no adverse effect on the reproduction of the tone values. On the contrary, it is even improved. This applies not only to the reproduction of originals which have a very high contrast but also to any originals which can be reproduced with this material, down to a contrast of 1.00. This is most clearly recognised by the variation in density of the positive produced from these negatives, starting for the sake of simplicity with standardised negatives which are copied on to positive photographic material which have a fixed gradation.

FIG. 4a represents the density curve of negatives which have been produced on the material characterised in FIG. 1 from an original which has a contrast range of $U_{or} = 1.00; 2.00$ and $3.00$, the "light parts" of each negative being registered at the point L. The quadrant FIG. 4b represents the density curve of the copying material ($\gamma = 1.40$) rotated through 90° ("windmill diagram") to correspond to the known graphic determination of copying curves. From this is obtained the variation in density of the standardised continuous-tone positives in accordance with FIG. 4c. It will be seen from this that the density curve (3) which belongs to the original which has the highest contrast 3.00 is curved. The reproduction of tone values of the shadow parts of the image is flattened at the expense of the light parts of the image; This is precisely the tone value variation which is required in practice (see, for example, PETER KASPER "Standardisierungsmethoden bei der Herstellung von Halbtonfarbauszugen" in Polygraph-Jahrbuch 1969, Publishers Polygraph, Frankfurt/Main, page 85 et seq).

Now the lower the contrast of the original, the more is the flattening of the dark parts of the image eliminated (curves (2) and (1) in FIG. 4c) so that the tone reproduction graph (1) in FIG. 4c, which belongs to the original which has the lowest reproducible contrast of 1.00, is almost rectilinear. This behaviour of the density curves also exactly accords with the demands of photographic practice which always stipulates the light parts of the image should be preserved, because it is they which decide the quality of reproduction of the image, whereas the dark parts of the image should be flattened more, as there is a larger number of total tone values to be accommodated on the given contrast range of the positive (DU = 1.40), i.e. the higher the contrast of the original.

Automatic control of the variation in tone value is dependent upon the contrast of the originals and hence an improvement in the tone values which is required in practice and cannot be achieved so simply by any other method is achieved by the process according to the invention. This example also makes it clear that the form of the negative density curve in the lightest parts (depths) largely depends on the extent to which reproduction of the shadows should be reduced in the positives. This again influences the size and position of the sag d and hence to a large extent the overall character of the variation in density of the photograph. It is only the regions of higher density ("lights" in the negative) which remain largely uninfluenced by this factor.

The present invention is not restricted to the example given above but may be subject to many variations. The density curve (FIG. 1) need not extend over a range of 4.00 log.It units in all cases if the maximum contrast of the originals which are being reproduced is lower. Thus, for example, for reproducing reflection copies which, as is well known in practice, do not exceed a contrast of 2.00, a correspondingly smaller log.It range is sufficient. The same applies to the copying of high contrast originals in the camera since the ground glass image of the camera also does not have a contrast higher than 2.00 owing to the flare of light. Here again the density curve of FIG. 1 may in principle be used (or some other density curve extending above $h > 3.0$); all that is necessary is to compress the scale of the abscissa (log.It axis) accordingly. The same applies if the progressive rise of the density curve (and hence also of the final density $D_E$) is required to be altered; in that case, the scale of the ordinate should be extended accordingly.

Any density curve of a given character can in this simple way be adapted to the given conditions.

Furthermore, the process presented here is not restricted to the condition that the contrast of the negatives produced according to the process should be $U_N = 1.00$ or $1.00 \pm 0.20$ or $1.00 \pm 0.10$.

Nor is the process according to the invention restricted to the condition that the contrast of the negatives produced by the process should be between 1.00 and 1.70. Other values for the range of contrast of the negatives may be laid down according to the conditions employed for processing the continuous-tone negatives, in particular the efficiency of the copying photographic material. Furthermore, the density $D_L$ for the light part in the negative may have a value other than 2.00.

Moreover, the density curves of the continuous-tone copying material (FIG. 2b) need not be rectilinear. For example, they may be steeper or flatter at the higher densities (depths) than at the lower densities, whereby the variation of tone values in the depths of the continuous-tone positives can be influenced in a definite manner.

The light sensitive film according to the invention may be provided with a different spectral sensitivity according to the purpose for which it is used. For the reproduction of black and white originals, it is only sensitive to blue or orthochromatic, as is usual. For the production of color separation records, on the other hand, it is panchromatic. In the latter case, it advantageously has the same sensitivity on exposure behind the separation filters (filter factors blue:green: red = 1:1:1) because this considerably simplifies the exposure process. Concerning its structure, the photographic material may comprise one or more light sensitive silver halide emulsion layers which may be arranged either on the same side or on both sides of the support, if desired with light absorbing dyes to suppress the diffusion of light into the layers.

Particularly advantageous are photographic materials with two light sensitive silver halide emulsion layers, one of which is relatively highly sensitive and has a flat gradation whereas the other layer has a steeper gradation and a lower threshold sensitivity, because a much higher sensitivity can thereby be achieved than with a mixture of the two emulsions, which is especially important for panchromatic films. Where the sensitivity is less important (black and white pictures, contact copies) the two emulsions may be mixed and applied in one layer to the support.

Lastly, the emulsion may be pepared by mixing three or more part emulsions with different properties in order to obtain the form of characteristic curve according to the invention. The preparation of such mixed emulsions is well known in photographic practice.

EXAMPLE 1

An Isopan fine grain silver halide gelatine emulsion of the type described in BIOS Final Report No. 1355, page 35, is applied onto one side of a transparent layer support of polyester having a thickness of 0.15 mm which is covered on the other side with an orange red antihalation layer. Wetting agents and stabilizers were added to the emulsion before casting; in addition, it was sensitized to green light by the addition of a mixture of equal parts of sensitizers Rr 340 (1:2000) and Rr 1650 (1:2000). These sensitizers are described in FIAT Final Report 943, pages 46 to 47 and pages 50 to 52. The thickness of the light sensitive layer is $8\mu$.

Over this layer is applied another layer consisting of the silver halide gelatine emulsion Atopan (BIOS Final Report No. 1355, page 42) to which the same sensitizers as above are added in addition to wetting agents and stabilizers. The thickness of the layer is $6\mu$.

When this layer is dry, a protective layer of pure gelatine is cast on it in a thickness of about 1 to $1.5\mu$.

The two-layered light sensitive material is used for the reproduction of black and white originals.

After exposure, the material is processed in a developer of the following composition:

| | |
|---|---|
| Monomethyl-p-aminophenolsulphate | 7.5 g |
| Anhydrous sodium sulfite | 40.0 g |
| Hydroquinone | 3.5 g |
| Anhydrous soda | 30.0 g |
| Potassium bromide | 3.0 g |

Make up with water to 1 l.
1 part of the developer is diluted with 1 part of water before use. Development time 5 minutes at 20°C. followed by fixing, washing and drying.

EXAMPLE 2

The two emulsions from Example 1 provided with their additives and sensitizers are mixed in equal parts and applied as a mixed emulsion to the support of polyester provided with antihalation layer to form an emulsion layer having a thickness of 15 $\mu$, and this emulsion layer is then covered with a protective gelatine layer.

Application and processing of the finished film are the same as in Example 1.

EXAMPLE 3

A layer of the emulsion Atopan (from Example 1) is cast in a thickness of 7 $\mu$ on a transparent, colorless layer support of polycarbonate based on bis-phenylolpropane having a thickness of 140 $\mu$ which has a dark green antihalation layer which is discolored in the photographic processing baths on the other side. The red sensitizer Rr 1953 (FIAT Final report 943, pages 53 to 56) is added to the emulsion in addition to wetting agents, stabilizers and the mxiture of equal parts of green sensitizers Rr 340 and Rr 1,650.

This layer is then covered with the fine grain Isopan emulsion from Example 1, also in a thickness of 7 $\mu$, but in this case the Isopan emulsion also contains an addition of the red sensitizer Rr 1953 in addition to the same two green sensitizers.

On this layer is then cast a 1 – 1.5 $\mu$ thick protective layer of pure hardened gelatine.

The two-layered light sensitive film is used for the production of color separation records for multicolor reproduction. Development is carried out for 5 minutes in the black and white developer mentioned above.

I claim:

1. A process for producing a standardized or prestandardized negative continuous-tone images or continuous-tone separation records on a photographic material having at least one light-sensitive silver halide emulsion layer from black and white or multi-colored originals of different contrasts comprising the steps of:

1. utilizing a photographic material having a characteristic curve having a substantially uniform progressive upward slope in a log It interval $h$ ranging at least over the greatest contrast range of all the originals and wherein the density situated at the half-way point of the interval $h$ of the characteristic curve of the silver halide emulsion layer is higher than the value at the start of the characteristic curve by 15 to 40% of the total contrast $U_K$ and that the curve has a maximum sag of at the most 50% of $U_K$ situated in the third or fourth fifth of the interval $h$,
2. determining the range of exposure for satisfactorily exposing the originals on the photographic material,
3. preselecting a series of contrast ranges for the originals,
4. correlating the series of contrast ranges with the ranges of exposures whereby the lower end of the series of contrast ranges is coordinated with the longest exposure and the upper end of the series of contrast is coordinated with the least acceptable exposure; and
5. exposing the originals on the photographic material in accordance with the correlated series of contrast ranges and ranges of exposures whereby the lower the contrast range of the original, the longer the exposure and the greater the contrast range of the original the shorter is the exposure.

2. A process as set forth in claim 1 wherein the series of contrast ranges is comprised of a series of discrete contrast ratios covering the exposure range of the characteristic curve of the photographic material in discrete steps.

3. A process as set forth in claim 1 wherein the exposure comprises a tabulation wherein the exposure range is predicated in multiples of basic exposures depending on the contrasts ranges of the originals and the series of contrasts ranges of the originals extends from a minimum of about 1 to a maximum of about 3.15.

4. A process as set forth in claim 1 wherein the characteristic curve of the photographic material is substantially as set forth in FIG. 1.

5. A process as set forth in claim 1 wherein the characteristic curve has a substantially exponential rise in accordance with the equation $D_{(x)} = 0.125 \cdot 2^x = 0.125 \cdot 10^{0.301x}$.

6. A process of making continuous tone positive copies from the negative images produced according to claim 1 as original including exposing a photographic copying material with at least one supported silver halide emulsion layer the contrast of which can be altered by the color of the light, proportionate exposure with light of two colors $F_1$ and $F_2$.

7. A process of making screened halftone image positive copies from a continuous-tone negative produced according to claim 1 as original including the step of exposing a photographic copying material having at least one silver halide emulsion layer with a very steep gradation of more than 7 through a colored contact screen arranged between the original and the photographic copying material, the contrast of the halftone image can be varied by the color of the copying light, proportionate exposure with two copying lights $F_1$ and $F_2$.

* * * * *